United States Patent
Kao et al.

(10) Patent No.: US 7,755,102 B2
(45) Date of Patent: Jul. 13, 2010

(54) HIGH BREAKDOWN VOLTAGE DIODE AND METHOD OF FORMING SAME

(75) Inventors: Lung-Ching Kao, Taipei (TW); Pu-Ju Kung, Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 686 days.

(21) Appl. No.: 11/542,420

(22) Filed: Oct. 3, 2006

(65) Prior Publication Data

US 2008/0079020 A1    Apr. 3, 2008

(51) Int. Cl.
*H01L 29/74* (2006.01)
*H01L 21/332* (2006.01)

(52) U.S. Cl. .................... 257/173; 257/164; 257/168; 257/E29.327; 257/E29.337; 438/140; 438/199; 438/200; 438/234; 438/309

(58) Field of Classification Search ................ 257/173, 257/E29.327, E29.337, 164, 168; 438/309, 438/199, 200, 234, 140
See application file for complete search history.

(56) References Cited

U.S. PATENT DOCUMENTS

| | | | |
|---|---|---|---|
| 4,967,256 A * | 10/1990 | Pathak et al. | ............. 257/112 |
| 5,479,031 A | 12/1995 | Webb et al. | |
| 5,516,705 A | 5/1996 | Webb et al. | ............. 437/6 |
| 6,639,253 B2 | 10/2003 | Duane et al. | |
| 7,129,144 B2 * | 10/2006 | Tseng | ............. 438/309 |
| 2005/0245006 A1 | 11/2005 | Tseng | |

FOREIGN PATENT DOCUMENTS

| | | |
|---|---|---|
| GB | 2113907 A | 8/1983 |
| GB | 2208257 | 3/1989 |
| WO | 00/35018 | 6/2000 |

OTHER PUBLICATIONS

Solid State Electronic Devices $5^{TH}$ Edition; B. Streetman et al.; Pearson Education, Inc. 2004.

* cited by examiner

*Primary Examiner*—Long K Tran
(74) *Attorney, Agent, or Firm*—Mayer & Williams PC; Stuart H. Mayer; Karin L. Williams

(57) ABSTRACT

A multiple layer overvoltage protection device is provided. The method begins by providing a substrate having a first impurity concentration of a first conductivity type to define a mid-region layer. A dopant of a second conductivity type is introduced into the substrate with a second impurity concentration less than the first impurity concentration. An upper base region having a second type of conductivity is formed on the upper surface of the mid-region layer. A lower base region layer having a second type of conductivity is formed on a lower surface of the mid-region layer. A first emitter region having a first type of conductivity is formed on a surface of the upper base region layer. A first metal contact is coupled to the upper base region layer and a second metal contact is coupled to the lower base region layer.

16 Claims, 3 Drawing Sheets

HIGH BREAKDOWN VOLTAGE DIODE AND METHOD OF FORMING SAME

FIELD OF THE INVENTION

The present invention relates generally to semiconductor devices, and more particularly to a multiple layer semiconductor device to provide overvoltage protection.

BACKGROUND OF THE INVENTION

Communications equipment, computers, home stereo amplifiers, televisions, and other electronic devices are increasingly manufactured using small electronic components which are very vulnerable to damage from electrical energy surges (i.e., transient over-voltages). Surge variations in power and transmission line voltages can severely damage and/or destroy electronic devices. Moreover, these electronic devices can be very expensive to repair and replace. Therefore, a cost effective way to protect these components from power surges is needed. Devices such as zener diodes and thyristors have been developed to protect these types of equipment from such power surges or over-voltage transients. These devices, typically discrete devices similar to discrete voltage-reference diodes, are employed to suppress transients of high voltage in a power supply or the like before the transients reach and potentially damage an integrated circuit or similar structure. A simple pn junction does not generally meet the requirements for reverse breakdown operation since, in practice, reverse breakdown occurs at a relatively unpredictable voltage where the junction meets a surface of the p and n regions.

FIG. 1 shows a two layer semiconductor junction diode of the type disclosed in UK Patent Appl. 2113907A, which provides a more predictable reverse breakdown voltage than is achievable with a simple pn junction. The junction diode includes an n-type substrate and a diffused p-type region formed in the n-type substrate. The diode has a conventional planar junction which has a selectively flat central region and curved edge regions which terminate at the surface of the n-type substrate. A buried n-type region 3 lies in the n-type substrate 1, adjacent to the central region of the planar junction. The p-type region 2 has a higher impurity concentration than both the n-type substrate 1 and the buried n-type region 3, while the buried n-type region 3 has a higher impurity concentration than the substrate 1.

FIG. 2 represents the impurity concentration profile of the pn junction of FIG. 1. As shown, the p-type region 2 extends from the surface of the diode to a depth of about 20 microns and varies in impurity concentration from about $10^{19}$ atoms/cc to that of n-type substrate 1, which is about $10^{15}$ atoms/cc. The buried n-type region 3 extends from the surface of the diode to a depth of about 40 microns and varies in impurity concentration from about $10^{17}$ atoms/cc to that of the n-type substrate 1. The p-type region 2, being initially of higher impurity concentration than the buried n-type region 3, is the dominant region to a depth of about 15 microns. The buried n-type region 3 dominates in the depth range from about 15 to 40 microns.

The presence of the buried n-type region 3 causes a reduction in the reverse breakdown voltage for the junction in the bulk material. The buried n-type region 3 modifies the junction structure so that under a reverse bias breakdown occurs through the buried region 3. The aforementioned patent application also shows a 4 layer diode in which a p-type anode region contacts the bottom surface of the substrate 1 and an n-type cathode region contact the p-type region 2. A similar 4 layer diode that employs a series of buried regions similar to buried n-type region 3 of FIG. 1 is shown in U.S. Pat. No. 5,516,705. The 4 layer diode shown in this patent also includes shorting dots in the n-type cathode region. The shorting dots are regions contiguous with the upper metal contact and are employed to improve the accuracy of the gating characteristics as a function of temperature.

While the use of the buried n-type region 3 shown in FIG. 1 of the conventional semiconductor junction diode device provides a more predictable reverse breakdown voltage, it also causes a reduction in the reverse breakdown voltage. For many applications however, a large value for the reverse breakdown voltage is desired.

SUMMARY OF THE INVENTION

In accordance with one aspect of the invention, a method is provided for making a multiple layer overvoltage protection device. The method begins by providing a substrate having a first impurity concentration of a first conductivity type to define a mid-region layer. A dopant of a second conductivity type is introduced into the substrate with a second impurity concentration less than the first impurity concentration. An upper base region having a second type of conductivity is formed on the upper surface of the mid-region layer. A lower base region layer having a second type of conductivity is formed on a lower surface of the mid-region layer. A first emitter region having a first type of conductivity is formed on a surface of the upper base region layer. A first metal contact is coupled to the upper base region layer and a second metal contact is coupled to the lower base region layer.

In accordance with another aspect of the invention, a plurality of discrete first shorting dot regions may be provided in the first emitter region.

In accordance with another aspect of the invention, the first type of conductivity is N-type and the second type of conductivity is P-type.

In accordance with another aspect of the invention, the first type of conductivity is a P-type and said second type of conductivity is a N-type.

In accordance with another aspect of the invention, a second emitter region having a first type of conductivity may be formed on a surface of the lower base region layer.

In accordance with another aspect of the invention, a second shorting dot region may be provided in the second emitter region.

In accordance with another aspect of the invention, a multiple layer overvoltage protection device is provided. The device includes a substrate having a first impurity concentration of a first conductivity type. The substrate defines a mid-region layer. The substrate further includes a dopant of a second conductivity type with a second impurity concentration less than the first impurity concentration. The device also includes an upper base region having a second type of conductivity located on the upper surface of the mid-region layer and a lower base region layer having a second type of conductivity located on a lower surface of the mid-region layer. A first emitter region having a first type of conductivity is located on a surface of the upper base region layer. A first metal contact is electrically coupled to the upper base region layer and a second metal contact is electrically coupled to the lower base region layer.

DETAILED DESCRIPTION

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art.

The present inventors have recognized that the breakdown voltage of a semiconductor junction diode device can be increased by reducing the overall impurity concentration in the starting substrate or wafer. Without being bound to any particular theory or model, the following analysis is presented to facilitate an understanding of the present invention.

As discussed, for example, in chapter 5 of *Solid State Electronic Devices*, 5th Edition, B. Streeman et al., Pearson Education, Inc., 2004, the contact potential $V_o$ across a pn junction of width $W_0$ can be expressed as:

$$V_0 = \frac{1}{2} \cdot |\varepsilon_0| \cdot W_0$$

where $\varepsilon_0$ is the electric field across the junction.

The breakdown voltage $V_B$ that arises under a certain critical electrical field $\varepsilon_C$ thus can be expressed as $$V_B = \frac{1}{2} \cdot |\varepsilon_c| \cdot W_B$$

where $W_B$ is the depletion width at device breakdown and $W_B > W_0$

As shown in Eq. (5-22) of *Solid State Electronic Devices* the equilibrium width $W_0$ of the junction can be expressed as $$W_0 = \left[ \frac{2 \in V_0}{q} \left( \frac{1}{N_a} + \frac{1}{N_d} \right) \right]^{\frac{1}{2}}$$

and thus $$W_B = \left[ \frac{2 \in V_B}{q} \left( \frac{1}{N_a} + \frac{1}{N_d} \right) \right]^{\frac{1}{2}}$$

where $N_a$ and $N_d$ are the doping concentrations of acceptor ions and donor ions, respectively.

Accordingly, $V_B$ can be expressed as:

$$V_B = \frac{\in \varepsilon_c^2}{2q} \left( \frac{N_a + N_d}{N_a N_d} \right)$$

In the case of a one sided abrupt junction in which one side is more heavily doped (i.e., $P^+N$) $N_a \gg N_d$ then (1-3) and be approached by following Eq.

$$V_B \approx \frac{\in \varepsilon_c^2}{2q} (N_d)^{-1}$$

In the present invention the pn junction is defined by a more lightly doped substrate and a more heavily doped upper base region (described below). Accordingly, $N_d$ represents the doping concentration of donor ions in the substrate, which may therefore be referred to as the bulk concentration of the substrate. The present invention reduces this bulk concentration in order to increase the breakdown voltage of the resulting semiconductor diode device.

Figure 3:
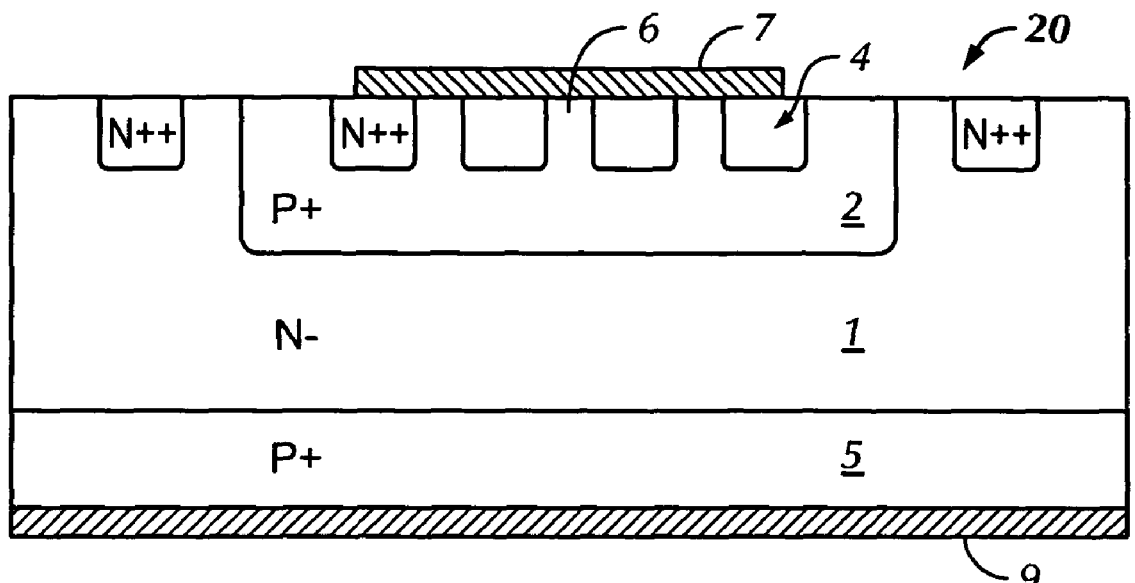
FIG. 3 shows one embodiment of a semiconductor junction diode device constructed in accordance with the present invention.

FIG. 3 shows one embodiment of a semiconductor junction diode device 20 constructed in accordance with the present invention. The device 20 includes metal contacts 7 and 9, an upper base region 2 having a cathode or emitter region 4 separated by shorting dots 6. The upper base 2 is P+-type conductivity while the emitter regions 4 are N++-type conductivity. The shorting dots 6 are P+-type conductivity like the upper base region 2. The emitter region 4 and the shorting dots 6 are coupled to the metal contact 7. Upper base 2 and emitter region 4 are formed by implantation and diffusion into a substrate 1 of N--type conductivity. A lower base or anode region 5 is formed on a lower surface of substrate 1 and is in contact with the metal contact 9. The lower base region is P+-type conductivity.

The P-type dopants (e.g., boron) add positive charges to the semiconductor material, while the N-type dopants (e.g., phosphorus) add negative charges to the semiconductor materials. Preferably, the P+ or N++ concentration approximately encompasses the range of $1 \times 10^{19}$ to $1 \times 10^{21}$ atoms/cm$^3$ and the P+ and N+ concentration approximately encompasses the range of $1 \times 10^{15}$ to $1 \times 10^{20}$ atoms/cm$^3$. The P− to P (or N− to N) range of dopant concentration approximately encompasses the range of $1 \times 10^{14}$ to $1 \times 10^{16}$ atoms/cm$^3$. The concentration in the regions may vary depending on what depth of the region is examined. Thus, these concentrations are provided only in approximate ranges.

Figure 1:
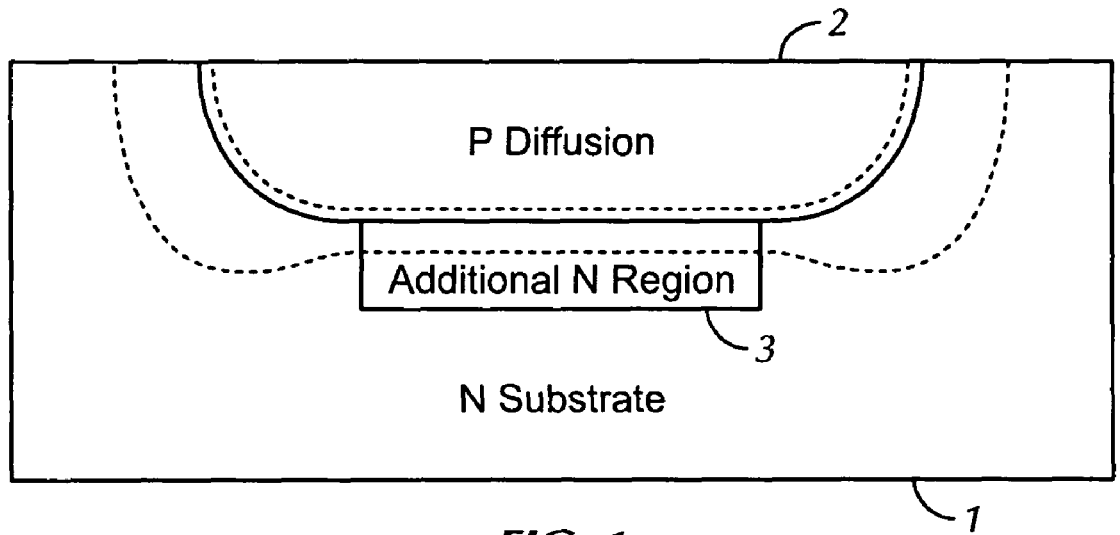
FIG. 1 shows a conventional two layer semiconductor junction diode.
Figure 2:
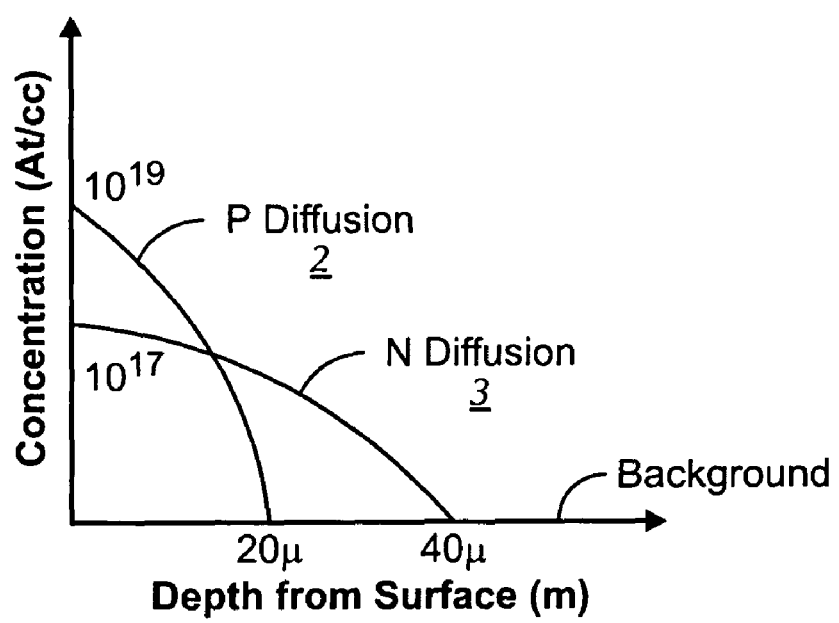
FIG. 2 represents the impurity concentration profile of the pn junction of FIG. 1.
Figure 4:
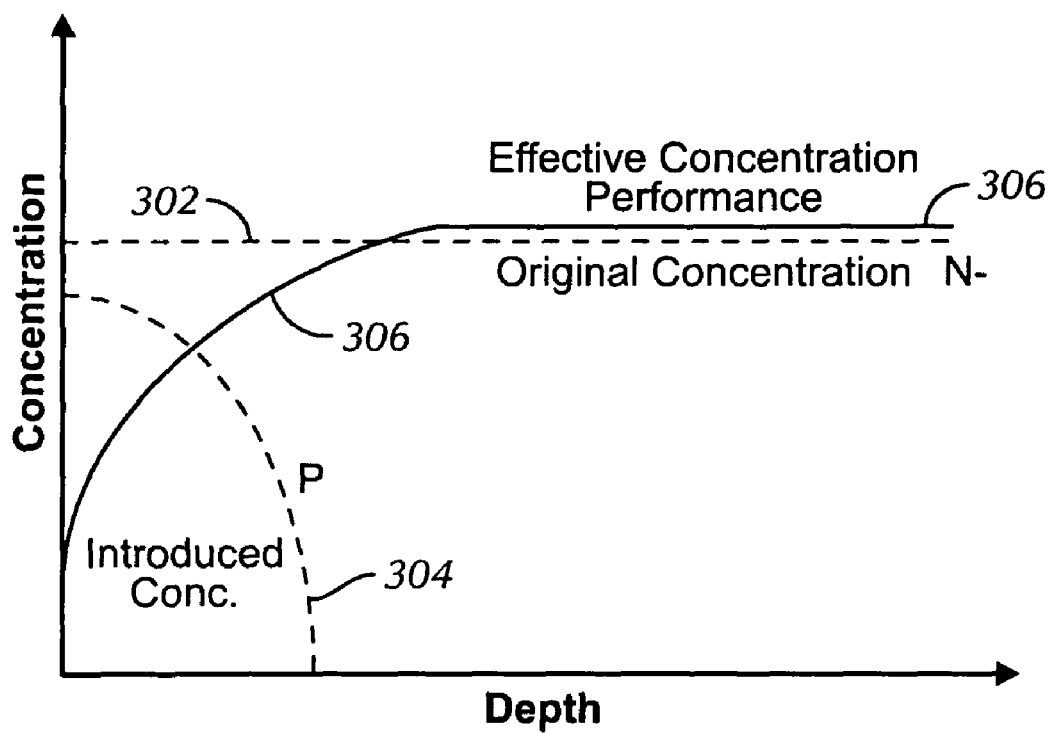
FIG. 4 shows impurity concentration profiles of the substrate for device shown in FIG. 3.

If the substrate 1 is initially doped so that it has a given impurity concentration of a given impurity type (the "background concentration" of the substrate), the present invention introduces into the substrate 1 a lower impurity concentration of the opposite impurity type. In this way the active bulk concentration $N_B$ discussed above is reduced, thereby increasing the breakdown voltage $V_B$ of the device. In contrast, in the conventional device of FIG. 1 the impurity concentration of the substrate is increased by introducing additional dopant of the same conductivity type as initially provided in the substrate to form higher impurity concentration regions such as buried region 3, while in the present invention an impurity is introduced that has a conductivity type that is opposite to the conductivity type initially present in the substrate 1. More specifically, since in the embodiment of the invention shown in FIG. 3 the substrate is of n-type conductivity, a p-type impurity is introduced. FIG. 4 shows the impurity concentration profile of the initial substrate (curve 302), the impurity concentration profile that is introduced into the substrate by implantation and diffusion (curve 304), and the net or effective concentration profile of the substrate after the additional dopant has been introduced (curve 306).

The semiconductor junction diode device of the present invention may be fabricated in accordance with well-known techniques including a variety of different growth or deposition techniques, as well as different photolithographic and implantation techniques. That is, the pn junctions defined by the substrate 1 and the upper base 2 and the lower base 5 may be formed in a conventional manner after introducing an impurity into the substrate 1 that has a conductivity type that is opposite to the conductivity type initially present in the substrate 1.

By way of example, computer simulations have demonstrated that a diode device having a breakdown voltage of 130V can be fabricated from a substrate initially doped with arsenic and having a resistivity of 0.5 ohms/sq (corresponding to an impurity concentration of $1.14 \times 10^{16}$/cc). This result can be achieved by introducing boron into the substrate by ion implantation at a dosage of $1 \times 10^{13}$ ions/cc with an energy of 20 Kev and a drive-in for about 1400 minutes at 1265° C. Without the introduction of boron, the diode device would have a breakdown voltage of only about 58V.

Figure 5:
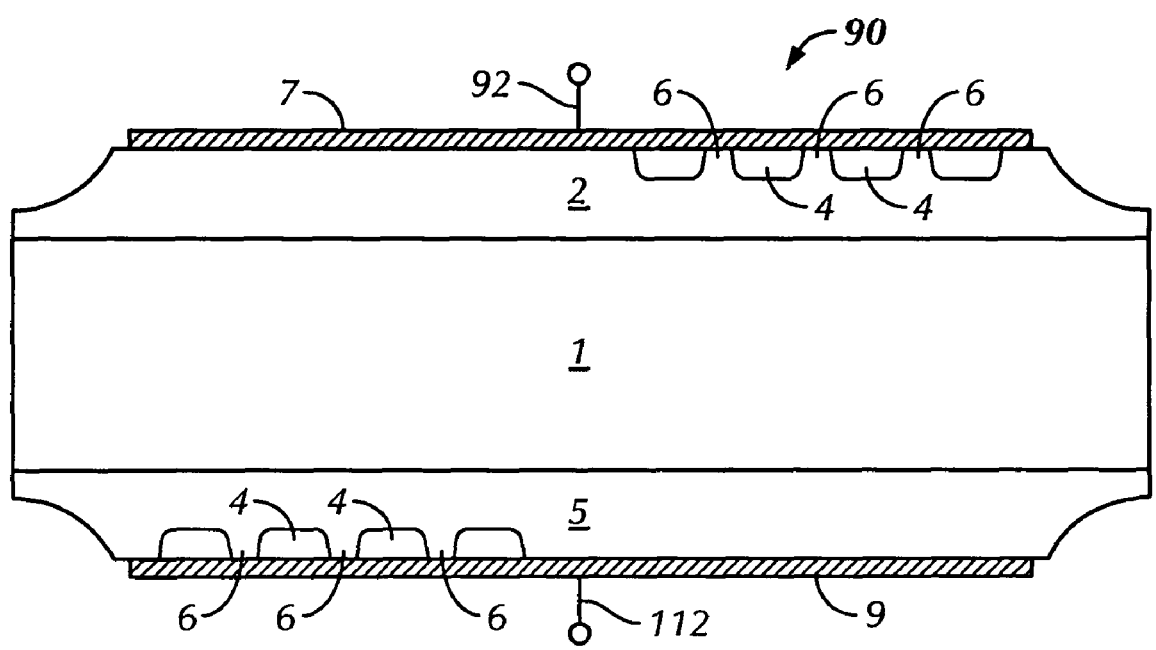
FIG. 5 shows one alternative embodiment of the invention that serves as a bidirectional overvoltage device.

The embodiment of the invention depicted in FIG. 3 is an asymmetrical device. The present invention, however, also encompasses bidirectional devices such as the device 90 depicted in FIG. 5. In FIGS. 3 and 5 like elements are denoted by like reference numerals. The device 90 has two metal contacts 7 and 9. Contact 7 may be connected to terminal 92 and contact 9 may be connected to terminal 112. The device 90 possesses two four-layer devices having a bidirectional current flow. On the right side of the circuit configuration 90, the device includes an upper base region 2, substrate 1 and a lower base region 5. The left hand of device 90 has a current flow in the opposite direction to that of the right side of the device. The circuit configuration on the left side of the device can be treated as being formed by an upper base region 5, a mid-region layer defined by the substrate 1 and a lower base region 2. Also with respect to the left hand circuit of device 90, the upper base region 5 is shown possessing emitter region 4 and shorting dots 6 coupled to the lower metal contact 9. The bidirectional configuration allows for either positive or negative polarity overvoltage protection from a single device. The device is fabricated using substantially the same conductivity types and concentrations as that disclosed in FIG. 3.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a semiconductor junction diode in which the conductivities of the various semiconductor regions are reversed from those described herein.

The invention claimed is:

1. A method of making a multiple layer overvoltage protection device comprising the steps of:
   providing a substrate having a first impurity concentration of a first conductivity type to define a mid-region layer;
   introducing a dopant of a second conductivity type into the substrate with a second impurity concentration less than the first impurity concentration;
   forming an upper base region having a second type of conductivity on the upper surface of said mid-region layer;
   forming a lower base region layer having a second type of conductivity on a lower surface of said mid-region layer;
   forming a first emitter region having a first type of conductivity on a surface of said upper base region layer;
   coupling a first metal contact to said upper base region layer; and
   coupling a second metal contact to said lower base region layer.

2. The method of making a multiple layer overvoltage protection device according to claim 1 further providing a plurality of discrete first shorting dot regions in said first emitter region.

3. The method of making a multiple layer overvoltage protection device according to claim 1 wherein said first type of conductivity is an N-type and said second type of conductivity is a P-type.

4. The method of making a multiple layer overvoltage protection device according to claim 1 wherein said first type of conductivity is a P-type and said second type of conductivity is a N-type.

5. The method of making a multiple layer overvoltage device according to claim 1 further comprising the step of forming a second emitter region having a first type of conductivity on a surface of said lower base region layer.

6. The method of making a multiple layer overvoltage device according to claim 5 further comprising the step of providing a second shorting dot region in said second emitter region.

7. The method of making a multiple layer overvoltage protection device according to claim 5 wherein said first type of conductivity is a P-type and said second type of conductivity is a N-type.

8. The method of making a multiple layer overvoltage protection device according to claim 5 wherein said first type of conductivity is an N-type and said second type of conductivity is a P-type.

9. A multiple layer overvoltage protection device, comprising:
   a substrate having a first impurity concentration of a first conductivity type, said substrate defining a mid-region layer, wherein said substrate further includes a dopant of a second conductivity type with a second impurity concentration less than the first impurity concentration;
   an upper base region having a second type of conductivity located on the upper surface of said mid-region layer;
   a lower base region layer having a second type of conductivity located on a lower surface of said mid-region layer;
   a first emitter region having a first type of conductivity located on a surface of said upper base region layer;
   a first metal contact electrically coupled to said upper base region layer; and
   a second metal contact electrically coupled to said lower base region layer.

10. The multiple layer overvoltage protection device according to claim 9 further comprising a plurality of discrete first shorting dot regions located in said first emitter region.

11. The multiple layer overvoltage protection device according to claim 9 wherein said first type of conductivity is an N-type and said second type of conductivity is a P-type.

12. The multiple layer overvoltage protection device according to claim 9 wherein said first type of conductivity is a P-type and said second type of conductivity is a N-type.

13. The multiple layer overvoltage device according to claim 9 further comprising a second emitter region having a first type of conductivity on a surface of said lower base region layer.

14. The multiple layer overvoltage device according to claim 13 further comprising a second shorting dot region in said second emitter region.

15. The multiple layer overvoltage protection device according to claim 13 wherein said first type of conductivity is a P-type and said second type of conductivity is a N-type.

16. The multiple layer overvoltage protection device according to claim 13 wherein said first type of conductivity is an N-type and said second type of conductivity is a P-type.

* * * * *